(12) United States Patent
Long et al.

(10) Patent No.: US 11,940,700 B2
(45) Date of Patent: Mar. 26, 2024

(54) ARRAY SUBSTRATE, DISPLAY PANEL AND DISPLAY DEVICE

(71) Applicant: BOE TECHNOLOGY GROUP CO., LTD., Beijing (CN)

(72) Inventors: Chunping Long, Beijing (CN); Hui Li, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 841 days.

(21) Appl. No.: 16/982,347

(22) PCT Filed: Apr. 14, 2020

(86) PCT No.: PCT/CN2020/084792
§ 371 (c)(1),
(2) Date: Sep. 18, 2020

(87) PCT Pub. No.: WO2020/248701
PCT Pub. Date: Dec. 17, 2020

(65) Prior Publication Data
US 2022/0326558 A1    Oct. 13, 2022

(30) Foreign Application Priority Data

Jun. 12, 2019   (CN) .......................... 201920881708.0

(51) Int. Cl.
*G02F 1/1368* (2006.01)
*G02F 1/1362* (2006.01)
*H01L 27/12* (2006.01)

(52) U.S. Cl.
CPC ...... *G02F 1/1368* (2013.01); *G02F 1/136286* (2013.01); *H01L 27/124* (2013.01)

(58) Field of Classification Search
None
See application file for complete search history.

(56) References Cited

U.S. PATENT DOCUMENTS

2007/0063957 A1    3/2007  Awakura et al.
2007/0076136 A1    4/2007  Matsuda
(Continued)

FOREIGN PATENT DOCUMENTS

CN          103034003 B     8/2015
CN          106356381    *  1/2017
(Continued)

*Primary Examiner* — Ashok Patel
(74) *Attorney, Agent, or Firm* — DINSMORE & SHOHL LLP

(57) ABSTRACT

The present disclosure relates to an array substrate, a display panel, and a display device. The array substrate comprises a display area and a non-display area surrounding the display area; wherein: the display area includes gate lines and data lines, and a plurality of pixel units defined by the intersections of gate lines and data lines, each of the pixel units including a thin film transistor and a pixel electrode electrically connected to a drain electrode of the thin film transistor; the non-display area includes a plurality of dummy pixel units arranged around the display area, each of the dummy pixel units including a dummy thin film transistor and a dummy pixel electrode floating relative to a drain electrode of the dummy thin film transistor; the non-display area further includes a dummy common electrode structure electrically connected to at least some of the dummy pixel units.

15 Claims, 5 Drawing Sheets

(56) References Cited

U.S. PATENT DOCUMENTS

2008/0002128 A1* 1/2008 Park .................. G02F 1/133512
349/143
2013/0148049 A1 6/2013 Abe et al.

FOREIGN PATENT DOCUMENTS

| CN | 107577099 A | 1/2018 |
| CN | 107942564 A | 4/2018 |
| CN | 108803173 A | 11/2018 |
| CN | 209946604 U | 1/2020 |

* cited by examiner

ARRAY SUBSTRATE, DISPLAY PANEL AND DISPLAY DEVICE

CROSS-REFERENCE TO RELATED APPLICATIONS

This application claims priority under 35 U.S.C. § 371 to International Patent Application No. PCT/CN2020/084792 filed on Apr. 14, 2020, which claims priority to the Chinese patent application 201920881708.0 filed on Jun. 12, 2019.

FIELD OF THE INVENTION

The present disclosure relates to an array substrate, a display panel, and a display device.

BACKGROUND

Thin Film Transistor Liquid Crystal Display (TFT-LCD) panels in flat panel display devices have the characteristics of small size, low radiation and relatively low manufacturing costs, which have been widely used in electronic products such as mobile phones, computers, and televisions.

Currently, there is still a need for improved TFT-LCD panels.

SUMMARY

Embodiments of the present disclosure provide an array substrate, a display panel, and a display device.

According to an aspect of the present disclosure, an embodiment of the present disclosure provides an array substrate comprising a display area and a non-display area surrounding the display area. The display area includes a plurality of gate lines and a plurality of data lines, and a plurality of pixel units defined by the intersections of gate lines and data lines. Each of the pixel units includes a thin film transistor and a pixel electrode electrically connected to a drain electrode of the thin film transistor. The non-display area includes a plurality of virtual pixel units arranged around the display area. Each of the dummy pixel units includes a dummy thin film transistor and a dummy pixel electrode floating relative to a drain electrode of the dummy thin film transistor. The non-display area further includes a dummy common electrode structure, dummy pixel electrodes of at least some of the dummy pixel units being electrically connected to the dummy common electrode structure.

In an example, in the array substrate, dummy pixel electrodes of all the dummy pixel units are electrically connected to the dummy common electrode structure.

In an example, the dummy common electrode structure includes a dummy common electrode and a dummy common electrode line; the dummy pixel electrodes are electrically connected to the dummy common electrode or the dummy common electrode line.

In an example, the dummy common electrode line and a common electrode line of the display area are arranged in the same layer; the dummy common electrodes are formed by extensions of the common electrodes of the display area or are formed on the same layer as the common electrodes of the display area.

In an example, the array substrate further includes a gate insulating layer and a passivation layer, wherein: the dummy pixel electrode is located on the passivation layer; the dummy common electrode and the dummy common electrode line are both arranged in the same layer as the gate lines; the dummy pixel electrode is electrically connected to the dummy common electrode through a via hole that sequentially penetrates the passivation layer and the gate insulating layer, or the dummy pixel electrode is electrically connected to the dummy common electrode line through a via hole that sequentially penetrates the passivation layer and the gate insulating layer.

In an example, the array substrate further includes an etching barrier layer located between the gate insulating layer and the passivation layer, and wherein the dummy pixel electrode is electrically connected to the dummy common electrode through a via hole that sequentially penetrates the passivation layer, the etching barrier layer, and the gate insulating layer, or the dummy pixel electrode is electrically connected to the dummy common electrode line through a via hole that sequentially penetrates the passivation layer, the etching barrier layer, and the gate insulating layer.

In an example, the dummy pixel units include first dummy pixel units and second dummy pixel units; dummy pixel units located at two ends of an extending direction of the gate lines are the first dummy pixel units, and dummy pixel units located at two ends of an extending direction of the data lines are the second dummy pixel units; the drain electrodes of the dummy thin film transistors in at least some of the second dummy pixel units have overlapping regions with the dummy pixel electrodes.

In an example, the drain electrodes of the dummy thin film transistors in all the second dummy pixel units have overlapping regions with the dummy pixel electrodes.

In an example, area of drain electrodes of the dummy thin film transistors in the second dummy pixel units are smaller than area of the dummy pixel electrode.

In an example, the area of the dummy pixel electrode is the same as the area of the pixel electrode.

According to another aspect of the present disclosure, an embodiment of the present disclosure provides an array substrate having a display area and a non-display area surrounding the display area. The display area includes a plurality of gate lines and a plurality of data lines, and a plurality of pixel units defined by the intersections of gate lines and data lines. Each of the pixel units includes a thin film transistor and a pixel electrode electrically connected to a drain electrode of the thin film transistor. The non-display area includes a plurality of dummy pixel units arranged around the display area, each of the dummy pixel units including a dummy thin film transistor and a dummy pixel electrode floating relative to a drain electrode of the dummy thin film transistor. The dummy pixel units include first dummy pixel units and second dummy pixel units; dummy pixel units located at two ends of an extending direction of the gate lines are the first dummy pixel units, and dummy pixel units located at two ends of an extending direction of the data lines are the second dummy pixel units; the drain electrodes of the dummy thin film transistors in at least some of the second dummy pixel units have overlapping regions with the dummy pixel electrodes.

In an example, the drain electrodes of the dummy thin film transistors in all the second dummy pixel units have overlapping regions with the dummy pixel electrodes.

In an example, area of drain electrodes of the dummy thin film transistors in the second dummy pixel units are smaller than area of the dummy pixel electrodes.

In an example, the area of the dummy pixel electrode is the same as the area of the pixel electrode.

According to another aspect of the present disclosure, an embodiment of the present disclosure further provides a display panel, including the array substrate according to any of the above embodiments of the present disclosure.

According to another aspect of the present disclosure, an embodiment of the present disclosure further provides a display device, including the above display panel provided in the embodiment of the present disclosure.

DETAILED DESCRIPTION

Figure 1:
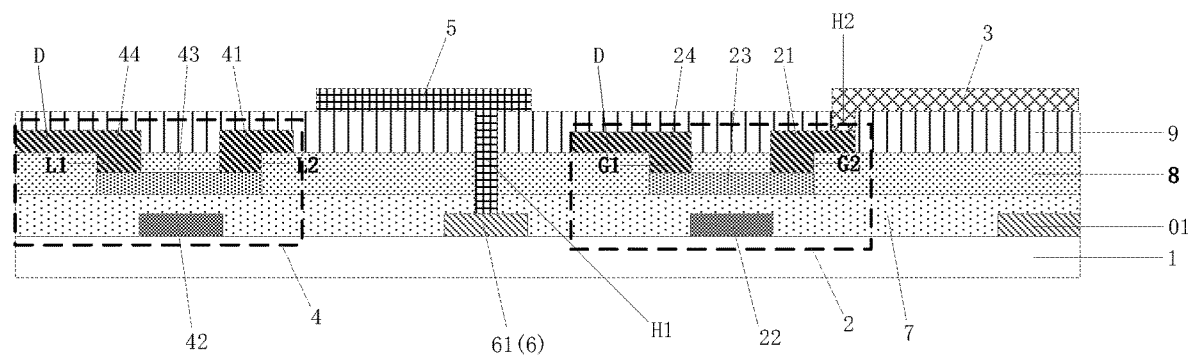
FIG. 1 is a schematic diagram of a cross-sectional structure of an array substrate provided by an embodiment of the disclosure.

In order to make the objectives, technical schemes, and advantages of the present invention more clear, specific implementations of the array substrate, the display panel, and the display device provided by the embodiments of the present disclosure will be described in detail below with reference to the accompanying drawings.

Thickness and shape of each layer of films in the drawings do not reflect the true scale thereof, and are only for a purpose of schematically illustrating the contents of the present disclosure.

In order to ensure etching uniformity of display pixels located at edges of the display area, a dummy pixel area with several rows or columns of dummy pixels is usually arranged at edges of the display area of an array substrate, so that dummy thin film transistors and dummy pixel electrodes are provided at edges of the display area. Since a dummy pixel electrode is not electrically connected to a dummy thin film transistor, and sometimes source and drain electrodes of the dummy thin film transistor are not electrically connected to an active area, two problems may arise: (1) a voltage greater than 0V may be generated at the dummy pixel electrode due to accumulation of static electricity during process, thereby creating a liquid crystal electric field in the dummy pixel area, leading to light leakage at the edges of the display area; and (2) since no effective electrical connections are formed for the dummy pixel electrodes and the dummy thin film transistors, static electricity generated during rubbing orientation of the liquid crystals is easy to accumulate on data lines in the display area, and the static electricity is transferred to pixel electrodes through thin film transistors in the display area, causing electrostatic damage to the pixel electrodes in the display area and affecting the display effect.

Figure 2:
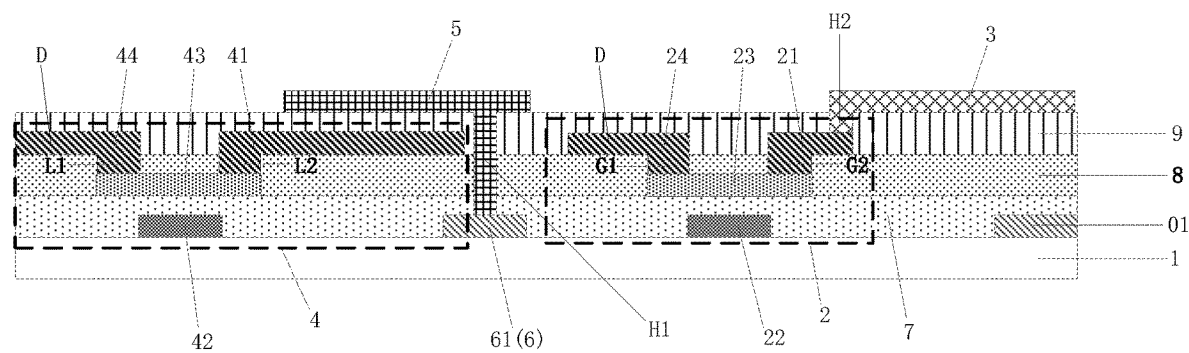
FIG. 2 is a schematic diagram of a cross-sectional structure of an array substrate provided by an embodiment of the disclosure.
Figure 3:
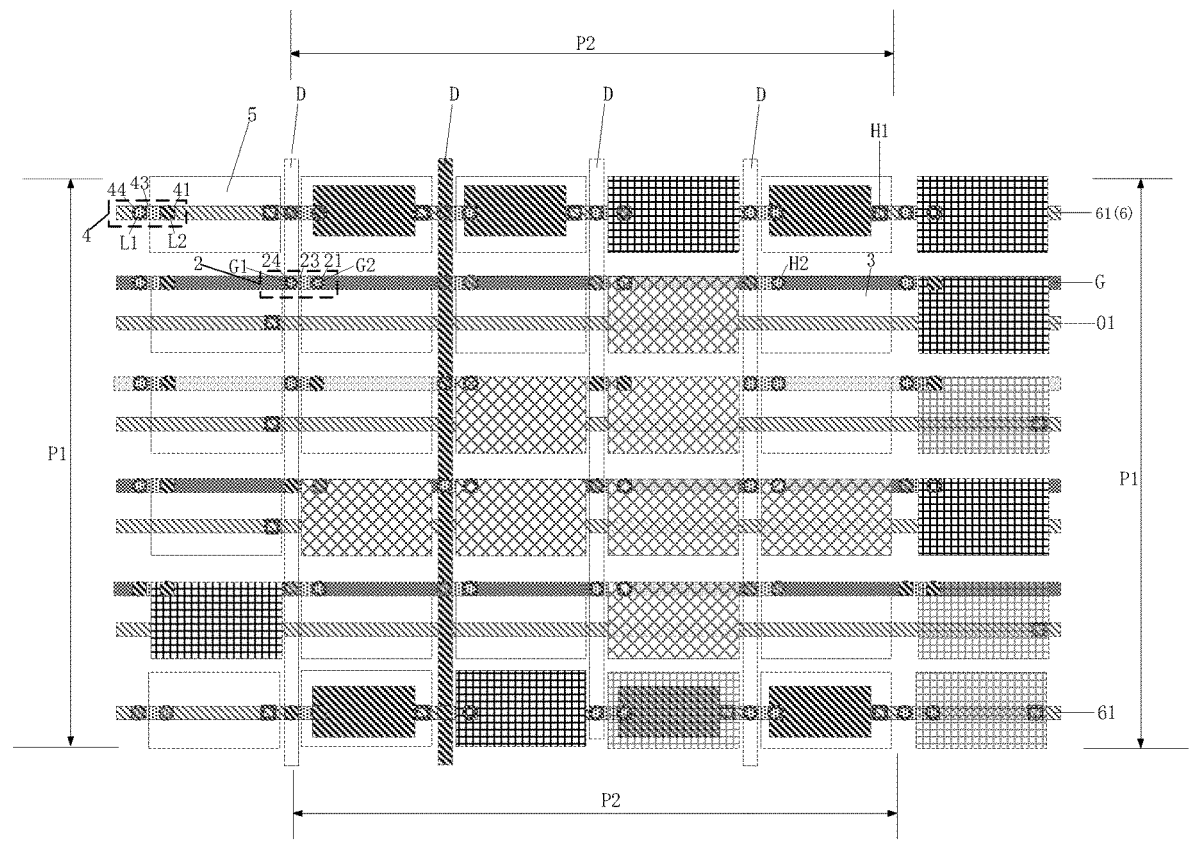
FIG. 3 is a schematic top view of the structure of the array substrate shown in FIG. 2.

Embodiments of the present disclosure provide an array substrate, as shown in FIGS. 1 to 3. FIGS. 1 and 2 are schematic diagrams showing cross-sectional structures of a portion of film layers of the array substrate, and FIG. 3 is a schematic diagram showing a top view of a portion of the film layers of the array substrate shown in FIG. 2. The array substrate has a display area A and a non-display area B surrounding the display area A. It can be understood that FIGS. 1 and 2 only show the structure of some film layers in the display area A and the non-display area B for illustrating embodiments of the present disclosure.

The display area A includes a plurality of gate lines G and a plurality of data lines D on the base substrate 1, and a plurality of pixel units defined by intersection of the gate lines G and the data lines D. Each pixel unit includes a thin film transistor 2 and a pixel electrode 3 electrically connected to drain electrode 21 of the thin film transistor 2.

The non-display area B includes a plurality of dummy pixel units arranged around the display area A. Each dummy pixel unit includes a dummy thin film transistor 4 and a dummy pixel electrode 5 floating with respect to drain electrode 41 of the dummy thin film transistor 4.

The non-display area B further includes a dummy common electrode structure 6, wherein dummy pixel electrodes 5 in at least some dummy pixel units are electrically connected to the dummy common electrode structure 6.

In the above array substrate provided in embodiments of the present disclosure, dummy pixel electrodes of at least some dummy pixel units arranged around the display area in the non-display area are electrically connected to the dummy common electrode structure, and the voltage of the dummy common electrode structure is generally 0V. Since at least some dummy pixel electrodes are electrically connected to the common electrode structure, at least some dummy pixel electrodes can always have the same 0V voltage as the common electrode structure. Therefore, no liquid crystal electric field will be created in an area where at least some dummy pixel units arranged around the display area are located. Thus, light leakage will not occur in at least part of the non-display area close to the edges of the display area, thereby improving display effect.

As shown in FIGS. 1 to 3, thin film transistor 2 of each pixel unit includes a gate electrode 22, an active layer 23, a source electrode 24, and a drain electrode 21 on the base substrate 1, the source electrode 24 being electrically connected to the active layer 23 through a via hole G1, the drain electrode 21 being electrically connected to the active layer 23 through a via hole G2, and the drain electrode 21 being electrically connected to the pixel electrode 3 through a via hole H2; dummy thin film transistor 4 of each dummy pixel unit includes: a gate electrode 42, an active layer 43, a source electrode 44, and a drain electrode 41 on the base substrate 1, the source electrode 44 being electrically connected to the active layer 43 through a via hole L1, the drain electrode 41 being electrically connected to the active layer 43 through a via hole L2, and the drain electrode 41 floating with respect to the dummy pixel electrode 5.

As shown in FIG. 3, dummy pixel electrodes 5 of all dummy pixel units arranged around the non-display area B close to the display area A are electrically connected to the dummy common electrode structure 6. In this way, the dummy pixel electrodes of all the dummy pixel units can always have the same 0V voltage as the common electrode structure, so that all the dummy pixel units arranged around the display area will not create a liquid crystal electric field, and no light leakage will occur in all the region of the non-display area close to the edge of the display area, thereby further improving the display effect.

As shown in FIGS. 1 to 3, the dummy common electrode structure 6 includes a dummy common electrode and a dummy common electrode line 61. FIGS. 1 and 2 only illustrate the dummy common electrode line 61 and a common electrode line 01.

The dummy pixel electrode 5 is electrically connected to the dummy common electrode, or the dummy pixel electrode 5 is electrically connected to the dummy common electrode line 61.

As shown in FIGS. 1 to 3, the dummy common electrode line 61 is arranged on the same layer as the common electrode line 01 in the display area; in this way, it is only necessary to change the original pattern when forming the common electrode line 01 in the display area, pattern of the dummy common electrode line 61 and the common electrode line 01 in the display area can be formed by one patterning process, without adding a separate process for preparing the dummy common electrode line 61, which can simplify the manufacturing process, save production costs, and improve production efficiency.

The dummy common electrode may be formed by an extension of the common electrode in the display area. The dummy common electrode can also be arranged on the same layer as the common electrode in the display area, that is, the dummy common electrode and the common electrode in the display area may be provided independently.

As shown in FIGS. 1 and 2, the array substrate further includes a gate insulating layer 7 and a passivation layer 9, the dummy pixel electrode 5 being located on the passivation layer 9.

Both the dummy common electrode and the dummy common electrode line 61 are arranged in the same layer as the gate line G.

The dummy pixel electrode 5 is electrically connected to the dummy common electrode through a via hole that sequentially penetrates the passivation layer 9 and the gate insulating layer 7, or the dummy pixel electrode is electrically connected to the dummy common electrode line 61 through a via hole that sequentially penetrates the passivation layer 9 and the gate insulating layer 7.

In addition, in order to prevent the active layer from being etched and damaged during the etching process of the source and drain electrodes, as shown in FIGS. 1 and 2, the array substrate further includes an etching barrier layer 8 between the gate insulating layer and the passivation layer 9. The dummy pixel electrode 5 is electrically connected to the dummy common electrode through a via hole that sequentially penetrates the passivation layer 9, the etching barrier layer 8 and the gate insulating layer 7. Or the dummy pixel electrode 5 is electrically connected to the dummy common electrode line 61 through a via hole H1 that sequentially penetrates the passivation layer 9, the etching barrier layer 8 and the gate insulating layer 7.

As shown in FIGS. 1 to 3, the pixel electrode 3 is electrically connected to the drain electrode 21 of the thin film transistor 2 through a via hole H2 that penetrates through the passivation layer 9.

As shown in FIG. 3, the dummy pixel units include first dummy pixel units P1 and second dummy pixel units P2; the dummy pixel units located at two ends of the extending direction of the gate lines G are the first dummy pixel units P1, and the dummy pixel units located at two ends of the extending direction of the data lines D are the second virtual pixel units P2; the drain electrodes 41 of the dummy thin film transistors 4 of at least some second dummy pixel units P2 have overlapping regions with the dummy pixel electrodes 5, as shown in FIG. 2. By arranging the drain electrodes 41 of the dummy thin film transistors of at least some second dummy pixel units P2 located at the two ends of the extending direction of the data lines D to have overlapping regions with the dummy pixel electrodes 5, since the drain electrodes 41 of the dummy thin film transistors 4 are floating with respect to the dummy pixel electrodes 5, a dummy capacitor is formed by this overlapping regions, wherein the drain electrode 41 and the dummy pixel electrode 5 are respectively two plates of the formed dummy capacitor. When static electricity accumulates on data lines D in the display area A, the static electricity can be discharged to the dummy capacitors through the active layers 43 of at least some dummy thin film transistors 4 instead of being coupled to the display area A, thereby reducing the probability of electrostatic damage to at least some pixel electrodes 3 in the display area A.

As shown in FIG. 2 and FIG. 3, the drain electrodes 41 of the dummy thin film transistors 4 of all the second dummy pixel units P2 have overlapping regions with the dummy pixel electrodes 5. By an arrangement in which the drain electrodes 41 of the dummy thin film transistors 4 of all the second dummy pixel units P2 at both ends of the extending direction of the data lines D have overlapping regions with the dummy pixel electrodes 5, dummy capacitor is formed. When static electricity accumulates on data lines D in the display area A, the static electricity can be completely discharged to the dummy capacitors through the active layers 43 of the corresponding dummy thin film transistors 4 instead of being coupled to the display area A, thereby reducing the probability of electrostatic damage to all pixel electrodes 3 in the display area A.

As shown in FIGS. 2 and 3, by an arrangement in which the drain electrodes 41 of the dummy thin film transistors of all the second dummy pixel units P2 located at the two ends of the extending direction of the data lines D have overlapping regions with the dummy pixel electrodes 5, dummy capacitor is formed. One terminal of the dummy capacitor (the dummy pixel electrode 5) is electrically connected to the common electrode, and the other terminal (the drain electrode 41) is electrically connected to the data line D through the dummy thin film transistor 4, so that there is no sudden change in the voltage between the two terminals of the dummy capacitor, and thereby the dummy capacitor can also function as a voltage regulator. In addition, since static electricity is a broadband signal, the capacitor itself has the effect of suppressing static electricity, especially large-capacity capacitors may be equivalent to a static electricity protection. Therefore, the dummy capacitor formed in the embodiment of the present disclosure provides a path for discharging static electricity better. Therefore, the array substrates shown in FIG. 2 and FIG. 3 provided by the embodiments of the present disclosure can not only prevent the occurrence of light leakage in the non-display area B close to the edge of the display area A, but also completely discharge the accumulated static electricity on the data lines D to the dummy capacitor through the active layers 43 of the corresponding dummy thin film transistors 4 without being coupled to the display area A, thereby reducing the probability of electrostatic damage to all pixel electrodes 3 in the display area A.

As shown in FIGS. 2 and 3, area of the drain electrode 41 of the dummy thin film transistor 4 of the second dummy pixel unit P2 is smaller than area of the dummy pixel electrode 5. For example, the drain electrode 41 of the dummy thin film transistor 4 is formed to extend in the direction of the dummy pixel electrode 5. Since the dummy pixel electrode 5 needs to be electrically connected to the dummy common electrode line 61 through a via hole, the area of the drain electrode 41 is smaller than that of the dummy pixel electrode 5. Since the larger the capacitance, the better the electrostatic protection effect, when the drain electrode 41 is formed, the area of the drain electrode 41 can be made approximate to the area of the dummy pixel electrode 5, to form a dummy capacitor with an overlapping region as large as possible, thereby achieving better electrostatic protection effect.

In order to unify the manufacturing process and facilitate manufacturing, as shown in FIGS. 1 to 3, area of the dummy pixel electrode 5 may be the same as area of the pixel electrode 3. Of course, in a specific implementation, the area of the dummy pixel electrode 5 may also be different from the area of the pixel electrode 3.

Figure 4:
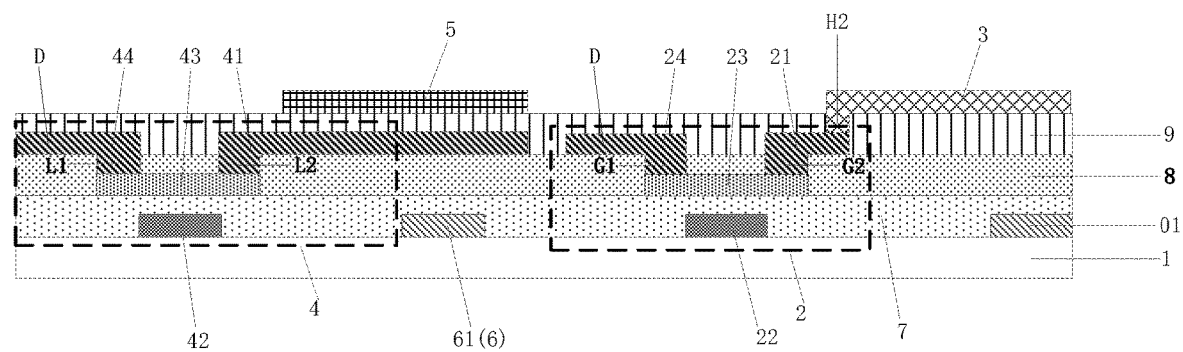
FIG. 4 is a schematic diagram of a cross-sectional structure of an array substrate provided by an embodiment of the disclosure.
Figure 5:
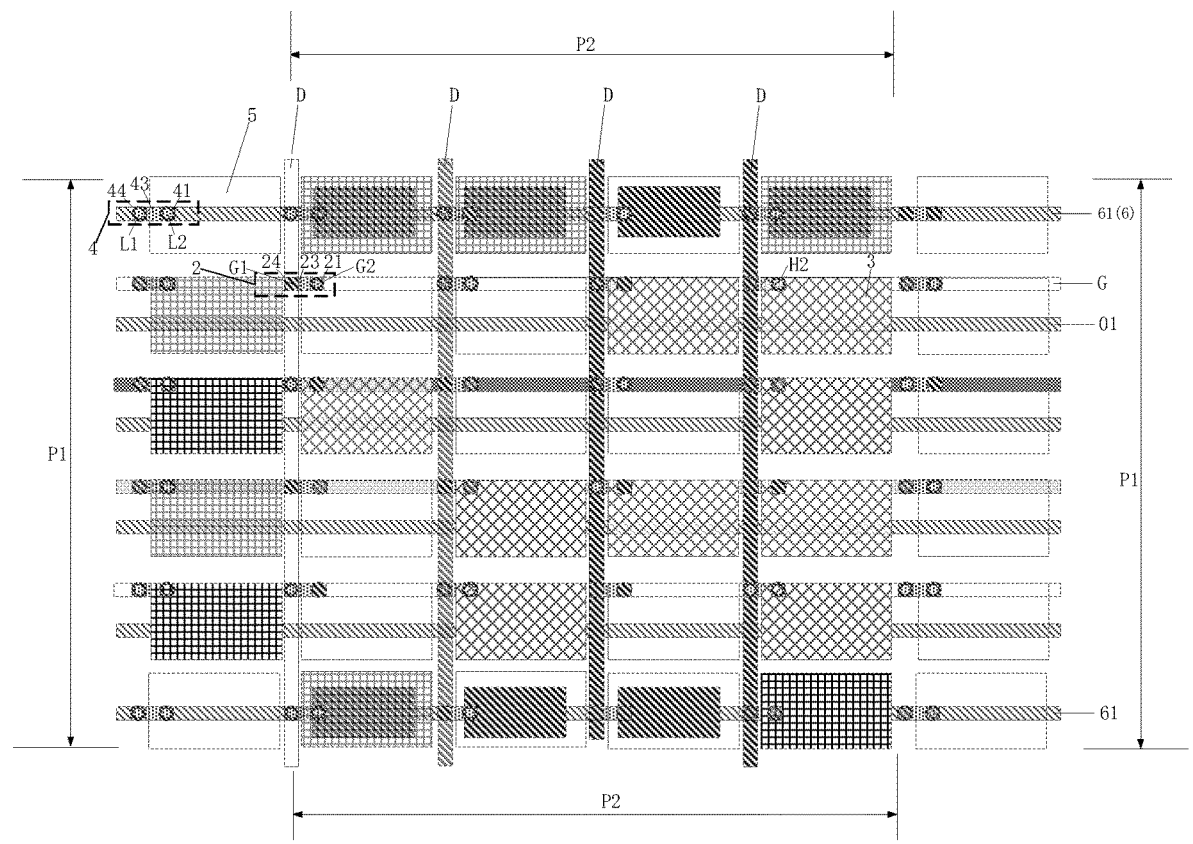
FIG. 5 is a schematic top view of the structure of the array substrate shown in FIG. 4.

Another array substrate is provided in an embodiment of the present disclosure provides as shown in FIGS. 4 and 5. FIG. 5 is a schematic top view of the structure of some film layers of the array substrate shown in FIG. 4. The array substrate has a display area A and a non-display area B surrounding the display area A. It can be understood that FIGS. 4 and 5 only show the structure of some film layers in the display area A and the non-display area B for illustrating the embodiment of the present disclosure.

The display area A includes a plurality of gate lines G and a plurality of data lines D on the base substrate 1, and a plurality of pixel units defined by intersection of the gate lines G and the data lines D. Each pixel unit includes a thin film transistor 2 and a pixel electrode 3 electrically connected to the drain electrode 21 of the thin film transistor 2.

The non-display area B includes a plurality of dummy pixel units arranged around the display area A. Each dummy pixel unit includes a dummy thin film transistor 4 and a dummy pixel electrode 5 floating with respect to the drain electrode 41 of the dummy thin film transistor 4.

The dummy pixel units include first dummy pixel units P1 and second dummy pixel units P2. Dummy pixel units located at two ends of the extending direction of the gate lines G are the first dummy pixel units P1, and dummy pixel units located at two ends of the extending direction of the data lines D are the second virtual pixel units P2. Drain electrodes 41 of dummy thin film transistors 4 in at least some second dummy pixel units P2 have overlapping regions with dummy pixel electrodes 5.

In the above array substrate provided in this embodiment of the present disclosure, by arranging the drain electrodes of the dummy thin film transistors of at least some second dummy pixel units located at the two ends of the extending direction of the data lines to have overlapping regions with the dummy pixel electrodes, since the drain electrode of the dummy thin film transistor is floating with respect to the dummy pixel electrode, a dummy capacitor is formed by this overlapping region, wherein the drain electrode and the dummy pixel electrode are respectively two plates of the formed dummy capacitor. When static electricity accumulates on data lines in the display area A, the static electricity can be discharged to the dummy capacitors through the active layers of at least some dummy thin film transistors instead of being coupled to the display area, thereby reducing the probability of electrostatic damage to at least some pixel electrodes in the display area.

As shown in FIGS. 4 to 5, the thin film transistor 2 of each pixel unit includes a gate electrode 22, an active layer 23, a source electrode 24, and a drain electrode 21 on the base substrate 1, the source electrode 24 being electrically connected to the active layer 23 through a via hole G1, the drain electrode 21 being electrically connected to the active layer 23 through a via hole G2, and the drain electrode 21 being electrically connected to the pixel electrode 3 through a via hole H2; the dummy thin film transistor 4 of each dummy pixel unit includes: a gate electrode 42, an active layer 43, a source electrode 44, and a drain electrode 41 on the base substrate 1, the source electrode 44 being electrically connected to the active layer 43 through a via hole L1, the drain electrode 41 being electrically connected to the active layer 43 through a via hole L2, and the drain electrode 41 floating with respect to the dummy pixel electrode 5.

The array substrate shown in FIG. 4 and FIG. 5 above further includes a gate insulating layer 7, an etching barrier layer 8 and a passivation layer 9. The pixel electrode 3 and the dummy pixel electrode 5 are arranged in the same layer and are located on the passivation layer 9. The pixel electrode 3 is electrically connected to the drain electrode 21 of the thin film transistor 2 through a via hole H2 penetrating the passivation layer 9.

As shown in FIG. 4 and FIG. 5, drain electrodes 41 of the dummy thin film transistors 4 of all the second dummy pixel units P2 have overlapping regions with the dummy pixel electrodes 5. By an arrangement in which the drain electrodes 41 of the dummy thin film transistors 4 of all the second dummy pixel units P2 at both ends of the extending direction of the data lines D have overlapping regions with the dummy pixel electrodes 5, dummy capacitor is formed. When static electricity accumulates on data lines D in the display area A, the static electricity can be completely discharged to the dummy capacitors through the active layers 43 of the corresponding dummy thin film transistors 4 instead of being coupled to the display area A, thereby reducing the probability of electrostatic damage to all pixel electrodes 3 in the display area A.

As shown in FIGS. 4 and 5, area of the drain electrode 41 of the dummy thin film transistor 4 of the second dummy pixel unit P2 is smaller than area of the dummy pixel electrode 5. For example, the drain electrode 41 of the dummy thin film transistor 4 is formed to extend in the direction of the dummy pixel electrode 5, since the dummy pixel electrode 5 needs to be electrically connected to the dummy common electrode line 61 through a via hole, the area of the drain electrode 41 is smaller than that of the dummy pixel electrode 5. Since the larger the capacitance, the better the electrostatic protection effect, when the drain electrode 41 is formed, the area of the drain electrode 41 can be made approximate to the area of the dummy pixel electrode 5, to form a dummy capacitor with an overlapping region as large as possible, thereby achieving better electrostatic protection effect.

In order to unify the manufacturing process and facilitate manufacturing, as shown in FIG. 5, the area of the dummy pixel electrode 5 may be the same as the area of the pixel electrode 3. Of course, in a specific implementation, the area of the dummy pixel electrode 5 may also be different from the area of the pixel electrode 3.

It should be noted that the embodiments provided in FIG. 3 and FIG. 5 of the present disclosure are based on an example where only one row and one column of dummy pixel units are provided at the edges of the non-display area surrounding the display area. However, in a specific implementation, multiple rows and multiple columns of dummy pixel units may be arranged at the edges of the non-display area around the periphery of the display area. In the case of providing multiple rows and multiple columns of dummy pixel units, the dummy pixel electrodes of all the dummy pixel units are electrically connected to the common electrode or the common electrode line. The drain electrodes of the dummy thin film transistors of all the second dummy pixel units located at the two ends of the extending direction of the data lines have overlapping regions with the dummy pixel electrodes 5, so as to form dummy capacitors.

A method for manufacturing the array substrate shown in FIG. 2 of the present disclosure will be described below with a specific embodiment.

Figure 6A:
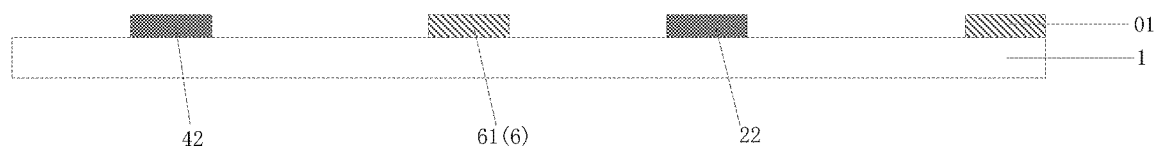
FIGS. 6A-6E are schematic diagrams of cross-sectional structures obtained after the execution of various steps of a method of manufacturing the array substrate provided by the embodiment of the present disclosure.

In step (1), a gate electrode 22 of a thin film transistor 2, a gate electrode 42 of a dummy thin film transistor 4, a common electrode line 01 and a dummy common electrode line 61 are formed on a base substrate 1 through one patterning process, as shown in FIG. 6A.

Figure 6B:
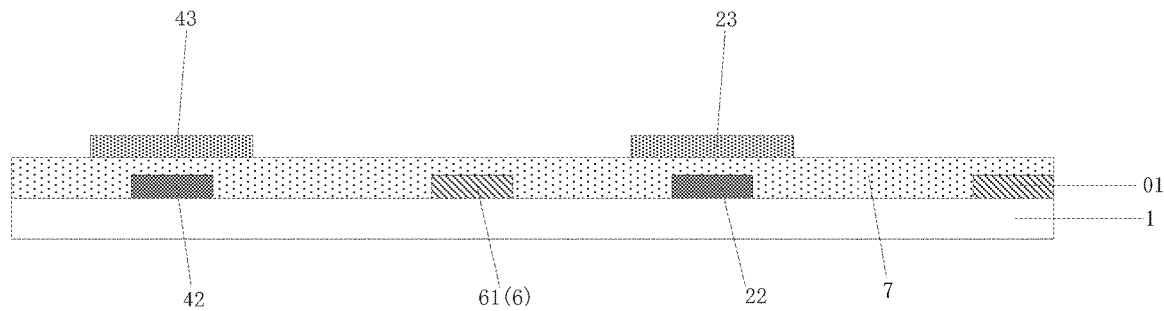

In step (2), a gate insulating layer 7 is formed on the basis of step (1), and an active layer 23 of the thin film transistor 2 and an active layer 43 of the dummy thin film transistor 4 are formed on the gate insulating layer 7, as shown in FIG. 6B.

Figure 6C:
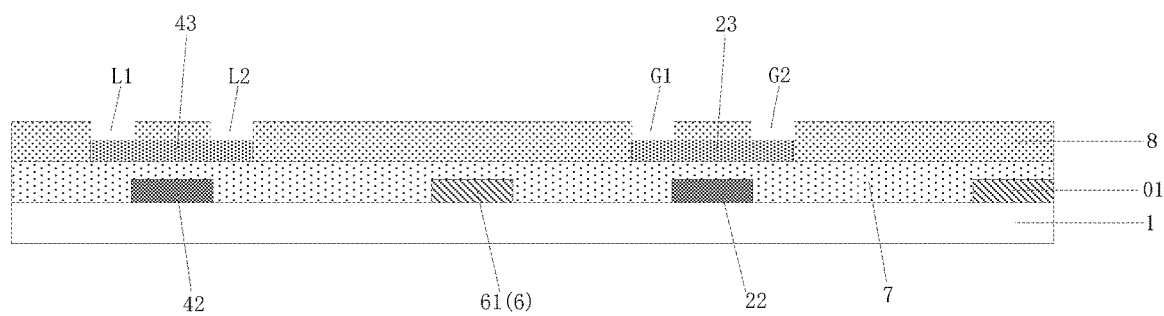

In step (3), an etching barrier layer 8 is formed on the basis of step (2), and via holes L1, L2, G1, and G2 are formed in the regions of the etching barrier layer 8 corresponding to a source electrode and a drain electrode to be formed through a patterning process, as shown in FIG. 6C.

Figure 6D:
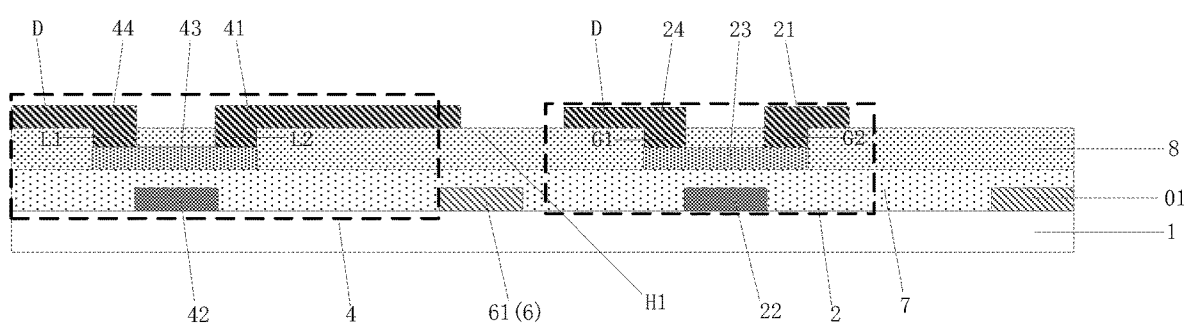

In step (4), a source electrode 24 and a drain electrode 21 of the thin film transistor 2, a source electrode 44 and a drain electrode 41 of the dummy thin film transistor 4, and a data line D are formed on the basis of step (3), as shown in FIG. 6D.

Figure 6E:
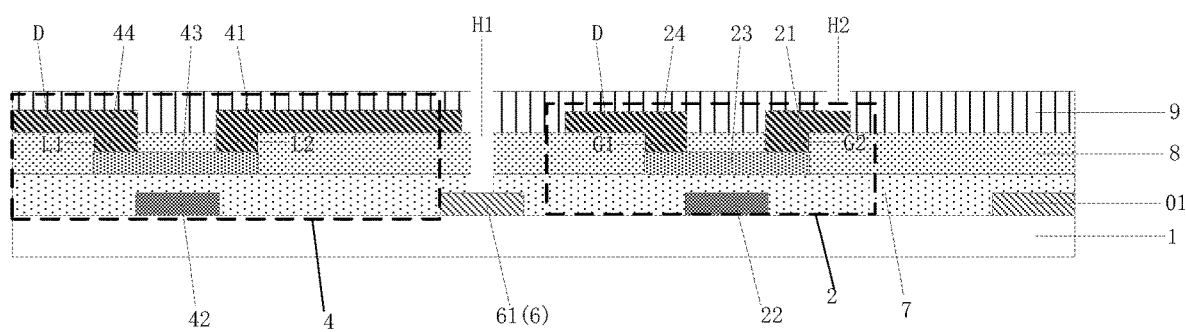

In step (5), a passivation layer 9 is formed on the basis of step (4), and a via hole H1 that sequentially penetrates the passivation layer 9, the etching barrier layer 8 and the gate insulating layer 7 is formed through a patterning process, and a via hole H2 penetrating the passivation layer 9 is formed by a patterning process, as shown in FIG. 6E.

In step (6), a pixel electrode 3 and a dummy pixel electrode 5 are formed on the basis of step (5), the pixel electrode 3 being electrically connected to the drain electrode 21 of the thin film transistor 2 through the via hole H2, and the dummy pixel electrode 5 being electrically connected to the dummy common electrode line 61 through the via hole H1, as shown in FIG. 2.

Through the above steps (1) to (6), the array substrate shown in FIG. 2 of the embodiment of the present disclosure can be manufactured.

For the method of manufacturing the array substrate shown in FIG. 1 and FIG. 4 of the embodiment of the present disclosure, reference can be made to the method of manufacturing the array substrate shown in FIG. 2 described above, which will not described in detail here.

It should be noted that in the manufacturing method of the array substrate, the patterning process may only include a photolithography process, or may include a photolithography process and etching steps, and may also include printing, ink-jetting and other processes for forming predetermined patterns. The photolithography process refers to a process including film formation, exposure, and development, for forming patterns using photoresist, masks, and an exposure machine, etc. A corresponding patterning process can be selected according to the structure formed in the present disclosure.

Based on the same inventive concept, an embodiment of the present disclosure further provides a display panel, including the array substrate of any one of the above embodiments of the present disclosure. The principle of the solution of the display panel is similar to that of the array substrate described above. Therefore, reference can be made to the implementation of the array substrate described above for the implementation of the display panel, which will not be repeated herein.

For example, the above display panel provided in the embodiment of the present disclosure is a liquid crystal display (Liquid Crystal Display, LCD) panel. In a specific implementation, as understood by those of ordinary skill in the art, the display panel has other essential components, which will not be described in detail herein, and should not be construed as limitation on the disclosure.

Based on the same inventive concept, a display device is further provided in an embodiment of the present disclosure, which includes the display panel provided in the embodiment of the present disclosure. The display device may be any product or component having a display function, such as a display panel, a mobile phone, a tablet computer, a television, a display, a notebook computer, a digital photo frame, a navigator, and the like. The principle of the solution of the display device is similar to that of the array substrate described above. Therefore, reference can be made to the implementation of the array substrate described above for the implementation of the display device, which will not be repeated herein.

In the above array substrate, display panel and display device provided in the embodiments of the present disclosure, the dummy pixel electrodes of at least some dummy pixel units in the non-display area arranged around the display area are electrically connected to the dummy common electrode structure, and the voltage of the dummy common electrode structure is generally 0V. Since at least some dummy pixel electrodes are electrically connected to the common electrode structure, at least some dummy pixel electrodes can always have the same 0V voltage as the common electrode structure, so that no liquid crystal electric field will be formed in a region where at least some dummy pixel units arranged around the display area are located. Therefore, light leakage will not occur in at least part of the non-display area close to the edge of the display area, thereby improving the display effect.

It will be apparent to those skilled in the art that various modifications and variations can be made to the embodiments of the present disclosure without departing from the spirit or scope of the present disclosure. In this case, if the modifications and variations made to the present disclosure fall within the scope of the claims of the present disclosure and equivalents thereof, the present disclosure is intended to comprise the modifications and variations.

What is claimed is:

1. An array substrates, comprising:
  a display area and a non-display area surrounding the display area, wherein:
  the display area includes a plurality of gate lines, a plurality of data lines, and a plurality of pixel units defined by intersections of gate lines and data lines, each of the pixel units including a thin film transistor having a drain electrode and a pixel electrode electrically connected to the drain electrode of the thin film transistor;
  the non-display area includes a plurality of dummy pixel units arranged around the display area, each of the dummy pixel units including a dummy thin film transistor having a drain electrode and a dummy pixel electrode floating relative to the drain electrode of the dummy thin film transistors;
  the dummy pixel units include first dummy pixel units and second dummy pixel units; dummy pixel units located at two ends of an extending direction of the gate lines are the first dummy pixel units, and dummy pixel units located at two ends of an extending direction of the data lines are the second dummy pixel units; drain electrodes of dummy thin film transistors in at least some of the second dummy pixel units have overlapping regions with dummy pixel electrodes;

the non-display area further includes a dummy common electrode structure, dummy pixel electrodes of at least some of the dummy pixel units being electrically connected to the dummy common electrode structure.

2. The array substrate according to claim 1, wherein dummy pixel electrodes of all the dummy pixel units are electrically connected to the dummy common electrode structure.

3. The array substrate according to claim 1, wherein:
the dummy common electrode structure includes a dummy common electrode and a dummy common electrode line; and
the dummy pixel electrodes are electrically connected to the dummy common electrode or the dummy common electrode line.

4. The array substrate according to claim 3, wherein:
the dummy common electrode line and a common electrode line of the display area are arranged in the same layer; and
the dummy common electrodes are formed by extensions of the common electrodes of the display area or are formed on the same layer as the common electrodes of the display area.

5. The array substrate according to claim 4, further comprising a gate insulating layer and a passivation layer, and wherein:
the dummy pixel electrode is located on the passivation layer;
the dummy common electrode and the dummy common electrode line are both arranged in the same layer as the gate lines; and
the dummy pixel electrode is electrically connected to the dummy common electrode through a via hole that sequentially penetrates the passivation layer and the gate insulating layer, or the dummy pixel electrode is electrically connected to the dummy common electrode line through a via hole that sequentially penetrates the passivation layer and the gate insulating layer.

6. The array substrate according to claim 5, further comprising an etching barrier layer located between the gate insulating layer and the passivation layer, and wherein the dummy pixel electrode is electrically connected to the dummy common electrode through a via hole that sequentially penetrates the passivation layer, the etching barrier layer, and the gate insulating layer, or the dummy pixel electrode is electrically connected to the dummy common electrode line through a via hole that sequentially penetrates the passivation layer, the etching barrier layer, and the gate insulating layer.

7. The array substrate according to claim 1, wherein area of the dummy pixel electrode is the same as area of the pixel electrode.

8. The array substrate according to claim 1, wherein drain electrodes of dummy thin film transistors in all the second dummy pixel units have overlapping regions with the dummy pixel electrodes.

9. The array substrate according to claim 8, wherein area of drain electrodes of the dummy thin film transistors in the second dummy pixel units are smaller than area of dummy pixel electrode.

10. An array substrate, comprising:
a display area and a non-display area surrounding the display area; wherein:
the display area includes a plurality of gate lines, a plurality of data lines, and a plurality of pixel units defined by intersections of gate lines and data lines, each of the pixel units including a thin film transistor and a pixel electrode electrically connected to a drain electrode of the thin film transistor;
the non-display area includes a plurality of dummy pixel units arranged around the display area, each of the dummy pixel units including a dummy thin film transistor and a dummy pixel electrode floating relative to a drain electrode of the dummy thin film transistor;
the dummy pixel units include first dummy pixel units and second dummy pixel units; dummy pixel units located at two ends of an extending direction of the gate lines are the first dummy pixel units, and dummy pixel units located at two ends of an extending direction of the data lines are the second dummy pixel units; drain electrodes of dummy thin film transistors in at least some of the second dummy pixel units have overlapping regions with dummy pixel electrodes.

11. The array substrate according to claim 10, wherein drain electrodes of the dummy thin film transistors in all the second dummy pixel units have overlapping regions with the dummy pixel electrodes.

12. The array substrate according to claim 11, wherein area of drain electrodes of the dummy thin film transistors in the second dummy pixel units are smaller than area of the dummy pixel electrodes.

13. The array substrate according to claim 10, wherein area of the dummy pixel electrodes is the same as area of the pixel electrodes.

14. A display panel, comprising the array substrate according to claim 1.

15. A display device, comprising the display panel according to claim 14.

* * * * *